(12) United States Patent
Pendharkar

(10) Patent No.: US 8,120,108 B2
(45) Date of Patent: Feb. 21, 2012

(54) HIGH VOLTAGE SCRMOS IN BICMOS PROCESS TECHNOLOGIES

(75) Inventor: Sameer P. Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 215 days.

(21) Appl. No.: 12/694,808

(22) Filed: Jan. 27, 2010

(65) Prior Publication Data
US 2011/0180870 A1    Jul. 28, 2011

(51) Int. Cl.
*H01L 29/66* (2006.01)
(52) U.S. Cl. ........ 257/341; 257/337; 257/343; 257/355; 257/360; 257/E29.256; 257/E29.258
(58) Field of Classification Search .................. 257/337, 257/343, 341, 355, 360, E29.256, E29.258
See application file for complete search history.

(56) References Cited

U.S. PATENT DOCUMENTS

| 6,614,077 | B2 * | 9/2003 | Nakamura et al. | 257/355 |
| 2006/0043487 | A1 * | 3/2006 | Pauletti et al. | 257/355 |
| 2006/0145260 | A1 * | 7/2006 | Kim | 257/355 |

* cited by examiner

*Primary Examiner* — Tan N Tran
(74) *Attorney, Agent, or Firm* — Jacqueline J. Garner; Wade J. Brady, III; Frederick J. Telecky, Jr.

(57) ABSTRACT

An integrated circuit having an SCRMOS transistor with a RESURF region around the drain region and SCR terminal. The RESURF region is the same conductivity type as the drift region and is more heavily doped than the drift region. An SCRMOS transistor with a RESURF region around the drain region and SCR terminal. A process of forming an integrated circuit having an SCRMOS transistor with a RESURF region around the drain region and SCR terminal.

18 Claims, 8 Drawing Sheets

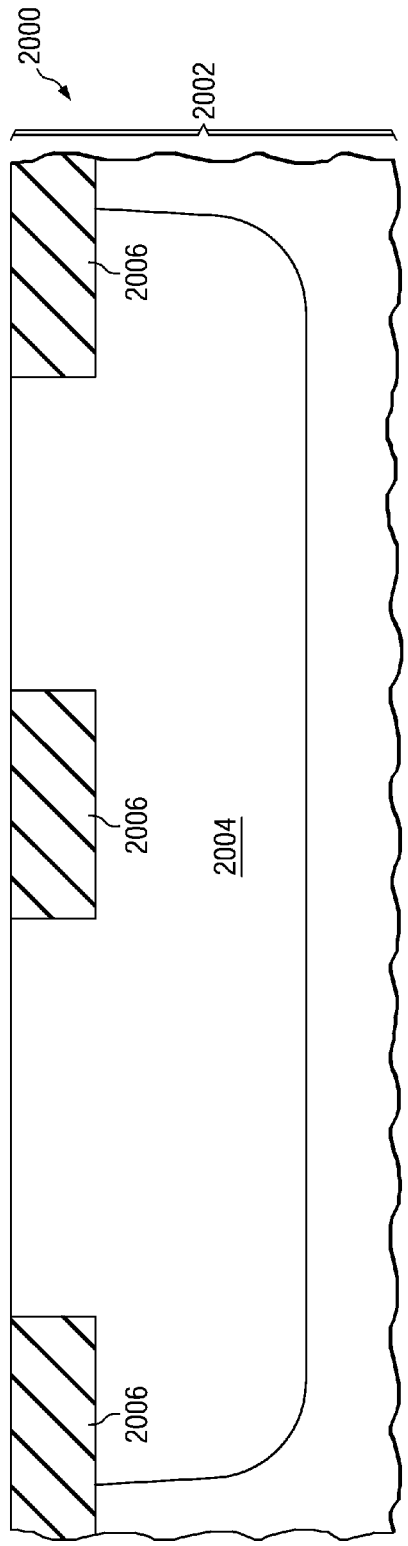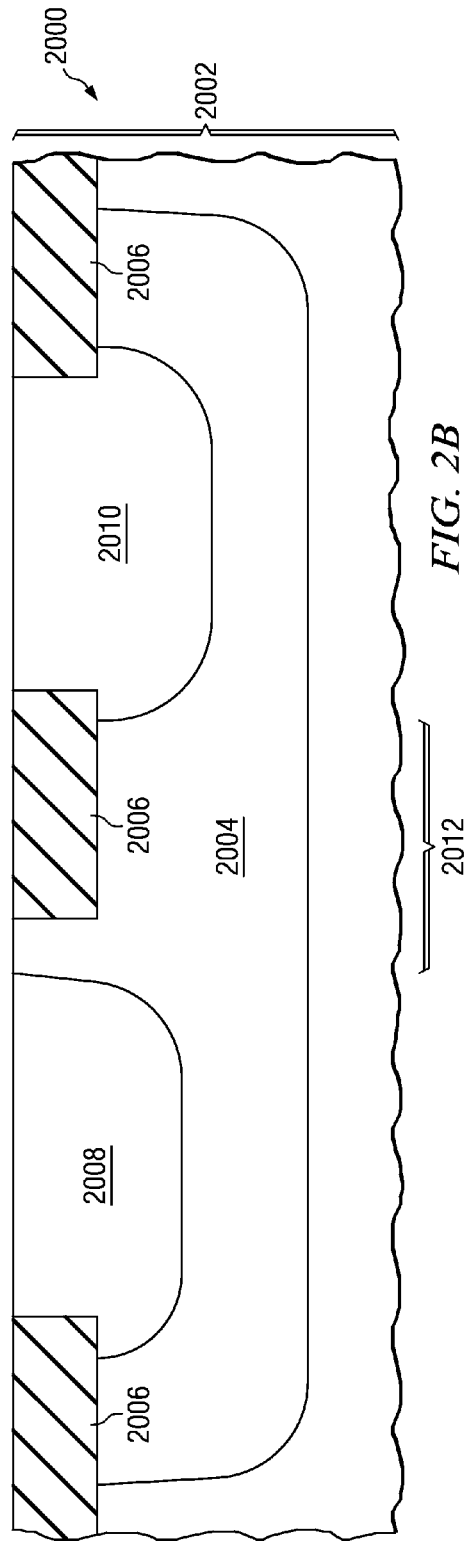

HIGH VOLTAGE SCRMOS IN BICMOS PROCESS TECHNOLOGIES

The following co-pending patent application is related and hereby incorporated by reference: U.S. patent application Ser. No. 12/694,872, filed simultaneously with this application).

FIELD OF THE INVENTION

This invention relates to the field of integrated circuits. More particularly, this invention relates to MOS transistors in integrated circuits.

BACKGROUND OF THE INVENTION

Metal oxide semiconductor (MOS) transistors integrated with silicon controlled rectifier (SCR) devices may exhibit degraded reliability from high voltage transients such as ESD events. During high voltage transients, charge carriers may be locally injected into lightly doped regions, causing a reduced voltage at the point of injection, which in turn may lead to more charge carrier injection. Localized charge carrier injection by this mechanism may cause device damage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit having an SCRMOS transistor in which the diffused drain region and the diffused SCR terminal are formed in a RESURF region. The RESURF regions has the same conductivity type as the drift region of the SCRMOS transistor, and a doping density at least two times the doping density of the drift region. The RESURF region may reduce negative resistance behavior of breakdown current between the drain structure and the source structure of the SCRMOS transistor.

DESCRIPTION OF THE VIEWS OF THE DRAWING

FIG. 2A through FIG. 2E are cross-sections of an integrated circuit containing an n-channel SCRMOS transistor formed according to an embodiment, depicted in successive stages of fabrication.

DETAILED DESCRIPTION

Figure 1:
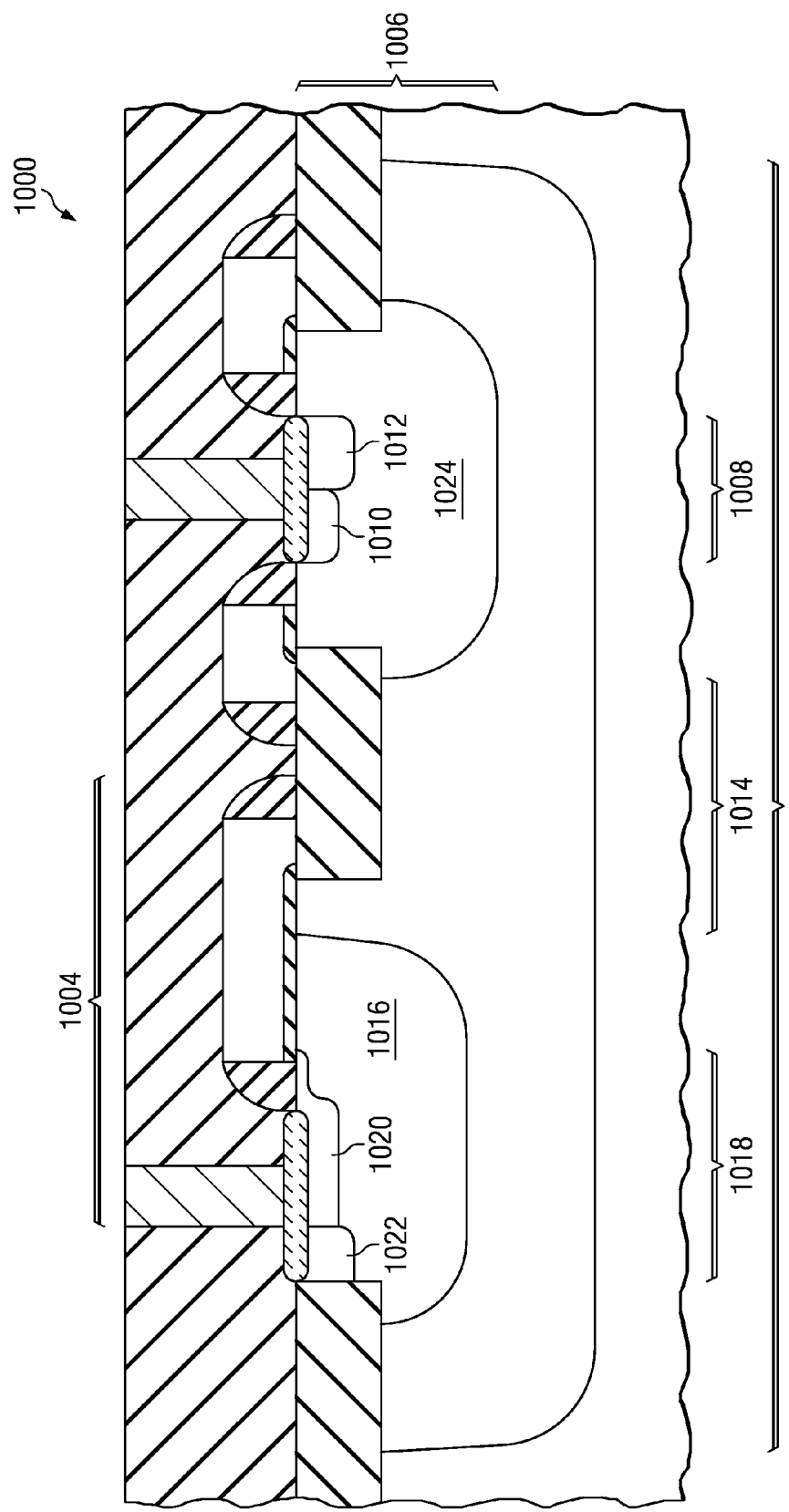
FIG. 1 is a cross-section of an integrated circuit containing an SCRMOS transistor formed according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As shown in FIG. 1, an integrated circuit 1000 may contain an SCRMOS transistor 1002, which is an MOS transistor 1004 integrated with an SCR device 1006. A drain structure 1008 of the SCRMOS transistor 1002 includes a diffused drain region 1010 and an SCR terminal 1012 of opposite conductivity type from the diffused drain region. A drift region 1014 with a same conductivity type as the diffused drain region 1010 and a lower doping density than the diffused drain region 1010 separates the drain structure 1008 from a body region 1016 and a source structure 1018. The body region 1016 has an opposite conductivity type from the diffused drain region 1010. The source structure 1018 includes a diffused source region 1020 with a same conductivity type as the diffused drain region 1010 and a body contact diffused region 1022 with a same conductivity type as the body region 1016. A RESURF region 1024 is formed around the source structure 1008 with a same conductivity type as the diffused drain region 1010, and a doping density between that of the drift region 1014 and the diffused drain region 1010. The RESURF region 1024 may reduce negative resistance behavior of breakdown current between the drain structure 1008 and the source structure 1018 of the SCRMOS transistor 1002.

The SCR terminal 1012 and the diffused source region 1020 form anode and cathode nodes of an SCR in the SCRMOS transistor 1002. The RESURF region 1024 and the drift region 1014 form a first of two internal nodes of the SCR, and the body region 1016 forms a second of the two internal nodes of the SCR.

For the purposes of this specification, a RESURF region will be understood to refer to a semiconductor or dielectric region adjacent to a depletion region which causes the depletion region to be further depleted in a direction different than an applied electric field in the depletion region.

Figure 2C:
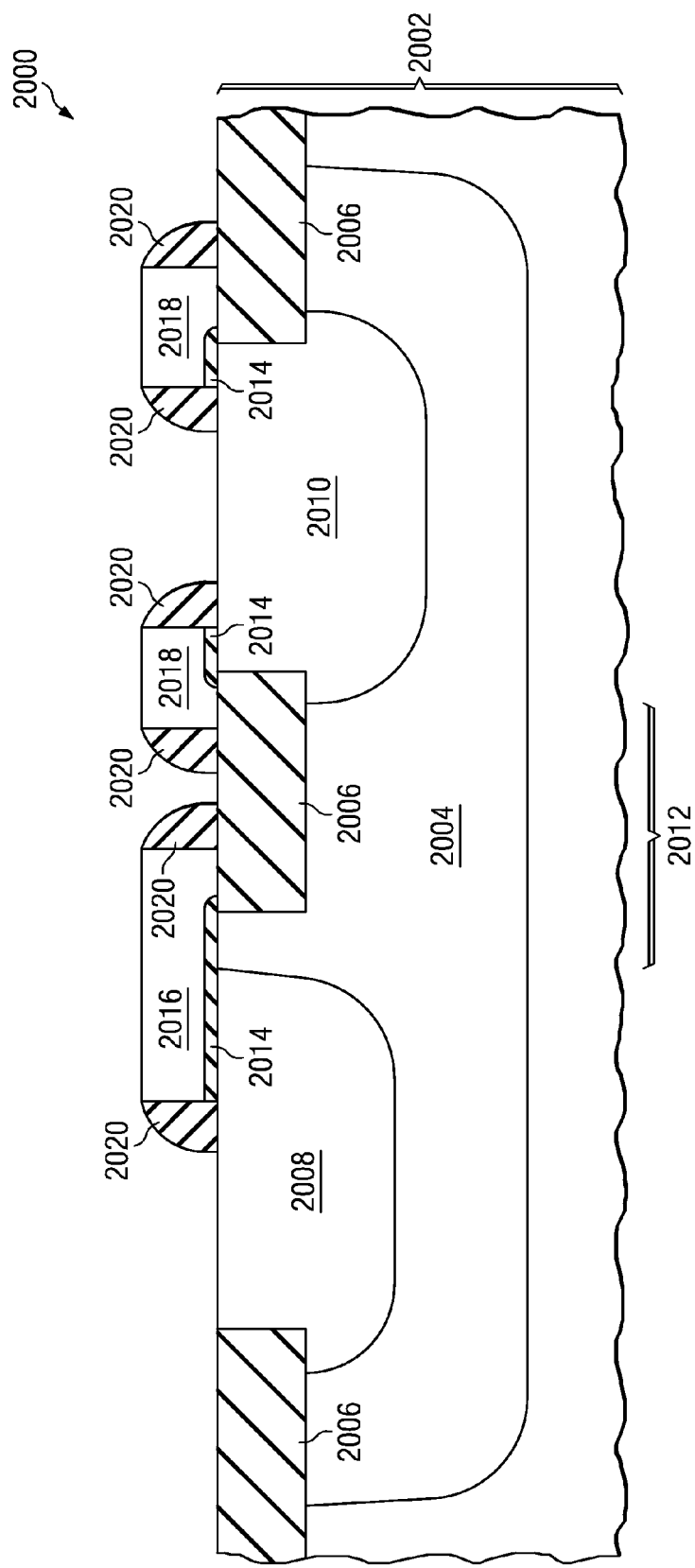

FIG. 2A through FIG. 2E are cross-sections of an integrated circuit containing an n-channel SCRMOS transistor formed according to an embodiment, depicted in successive stages of fabrication. Referring to FIG. 2A, the integrated circuit 2000 is formed in and on a substrate 2002 which may be a single crystal silicon wafer, a silicon-on-insulator (SOI) wafer, a hybrid orientation technology (HOT) wafer with regions of different crystal orientations, or other material appropriate for fabrication of the integrated circuit 2000. In the instant embodiment, a top layer of the substrate 2002 in a region defined for the SCRMOS transistor is p-type. A deep n-type well 2004, commonly known as a deep n-well 2004, is formed in the substrate 2002, for example by ion implanting n-type dopants such as phosphorus, arsenic and antimony into the substrate 2002. In one realization of the instant embodiment, the deep n-well 2004 may be formed by ion implanting phosphorus in a dose between $1\times10^{12}$ and $1\times10^{13}$ atoms/cm$^2$ at an energy between 50 keV and 3 MeV, followed by annealing the integrated circuit at a temperature above 1050 C for more than 4 hours. In one realization of the instant embodiment, a doping density of the deep n-well 2004 may be between $1\times10^{15}$ and $1\times10^{17}$ atoms/cm$^3$. Other processes for forming the deep n-well 2004 are within the scope of the instant embodiment.

Elements of field oxide 2006 are formed at a top surface of the substrate 2002, commonly of silicon dioxide between 250 and 600 nanometers thick, for example by shallow trench isolation (STI) or local oxidation of silicon (LOCOS) processes. In one realization of the instant embodiment, an element of field oxide 2006 may laterally separate a drain area of the SCRMOS transistor from a source area of the SCRMOS transistor. The deep n-well 2004 overlaps and may extend past the drain area and the source area.

Referring to FIG. 2B, a p-type body region 2008 is formed in the source area, for example by ion implanting p-type dopants such as boron and possibly gallium into the substrate 2002. In one realization of the instant embodiment, the body region 2008 may be formed by ion implanting boron in a dose between $5\times10^{13}$ and $5\times10^{14}$ atoms/cm$^2$ at an energy between 200 keV and 500 keV. In one realization of the instant embodiment, a doping density of the body region 2008 may be between $5\times10^{16}$ and $1\times10^{18}$ atoms/cm$^2$.

An n-type RESURF region 2010 is formed in the drain area, for example by ion implanting n-type dopants into the substrate 2002. In one realization of the instant embodiment, the RESURF region 2010 may be formed by ion implanting phosphorus in a dose between $2\times10^{13}$ and $6\times10^{13}$ atoms/cm$^2$ at an energy between 250 keV and 500 keV. The RESURF region 2010 is laterally separated from the body region 2008 by a portion of the deep n-well 2004 commonly referred to as a drift region 2012 of the SCRMOS transistor. A doping density of the RESURF region 2010 is at least two times greater than a doping density of the drift region 2012. In one realization of the instant embodiment, the doping density of the RESURF region 2010 may be greater than $1\times10^{13}$ atoms/cm$^3$. In one realization of the instant embodiment, the doping density of the RESURF region 2010 may be between 5 and 50 times the doping density of the drift region 2012.

Referring to FIG. 2C, a gate dielectric layer 2014 is formed on the top surface of the substrate 2002 in the drain area and the source area. The gate dielectric layer 2014 may be one or more layers of silicon dioxide (SiO$_2$), silicon oxy-nitride (SiON), aluminum oxide (Al$_2$O$_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer 2014 may include nitrogen as a result of exposure to a nitrogen containing plasma or a nitrogen containing ambient gas at temperatures between 50 C and 800 C. The gate dielectric layer 2014 is typically between 3 and 15 nanometers thick. The gate dielectric layer 2014 may be formed by any of a variety of gate dielectric formation processes, for example thermal oxidation, plasma nitridation of an oxide layer, and/or dielectric material deposition by atomic layer deposition (ALD).

An MOS gate 2016 is formed on a top surface of the gate dielectric layer 2014 overlapping a portion of the body region 2008. The MOS gate 2016 may be formed of polycrystalline silicon commonly known as polysilicon, titanium nitride, or other electrically conductive material. In some realizations of the instant embodiment, MOS gates 2016 formed of polysilicon may be partially or completely converted to metal silicide such as nickel silicide, cobalt silicide, titanium silicide or platinum silicide.

A field plate 2018 may be formed on the top surface of the gate dielectric layer 2014 in the drain area. The field plate 2018 may be formed of the same material as the MOS gate 2016. In some realizations of the instant embodiment, the field plate 2018 may be formed concurrently with the MOS gate 2016. In some realizations of the instant embodiment, the field plate 2018 may be electrically coupled to the MOS gate 2016.

In some realizations of the instant embodiment, sidewall spacers 2020 may be formed on lateral surface of the MOS gate 2016 and the field plate 2018 if present. The sidewall spacers 2020 may be formed for example by deposition of one or more conformal layers of silicon nitride and/or silicon dioxide on an existing top surface of the integrated circuit 2000, followed by removal of the conformal layer material from the top surfaces of the substrate 2002, the MOS gate 2016 and the field plate 2018 if present by known anisotropic etching methods, leaving the conformal layer material on the lateral surfaces of the MOS gate 2016 and the field plate 2018 if present.

Figure 2D:
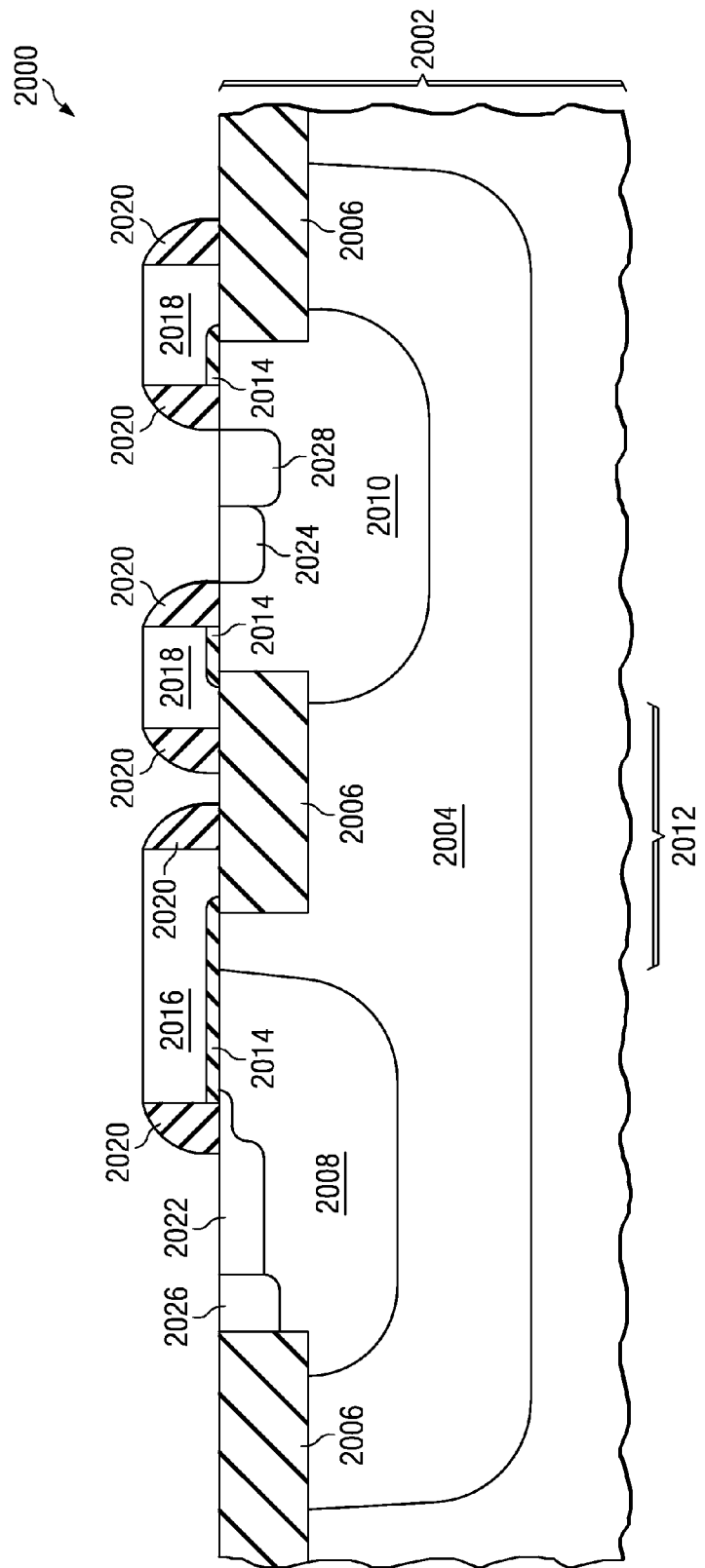

Referring to FIG. 2D, an n-type source diffused region 2022 is formed at the top surface of the substrate 2002 adjacent to the MOS gate 2016 in the source area. In one realization of the instant embodiment, the source diffused region 2022 includes an extension under the sidewall spacer 2020 if present and the MOS gate 2016, commonly known as an NLDD (n-type lightly doped drain) region. The source diffused region 2022 may be formed by ion implanting n-type dopants into the substrate 2002. In one realization of the instant embodiment, the source diffused region 2022 may be formed by ion implanting arsenic in a dose between $5\times10^{14}$ and $5\times10^{15}$ atoms/cm$^2$ at an energy between 20 keV and 60 keV, and ion implanting phosphorus in a dose between $5\times10^{13}$ and $5\times10^{14}$ atoms/cm$^2$ at an energy between 50 keV and 100 keV.

An n-type drain diffused region 2024 is formed at the top surface of the substrate 2002 in the drain area. A doping density of the drain diffused region 2024 is at least three times greater than the doping density of the RESURF region 2010. The drain diffused region 2024 may also be formed by ion implanting n-type dopants into the substrate 2002. In one realization of the instant embodiment, the drain diffused region 2024 may be formed concurrently with the source diffused region 2022. In the instant embodiment, the drain diffused region 2024 is within the RESURF region 2010.

A p-type body contact diffused region 2026 is formed at the top surface of the substrate 2002 adjacent to the source diffused region 2022 in the source area. The body contact diffused region 2026 may be formed by ion implanting p-type dopants into the substrate 2002. In one realization of the instant embodiment, the body contact diffused region 2026 may be formed by ion implanting boron in a dose between $1\times10^{15}$ and $4\times10^{15}$ atoms/cm$^2$ at an energy between 5 keV and 15 keV.

A p-type SCR terminal 2028 is formed at the top surface of the substrate 2002 adjacent to the drain diffused region 2024 in the drain area. The SCR terminal 2028 may also be formed by ion implanting p-type dopants into the substrate 2002. In one realization of the instant embodiment, the SCR terminal 2028 may be formed concurrently with the body contact diffused region 2026. In the instant embodiment, the SCR terminal 2028 is within the RESURF region 2010.

Figure 2E:
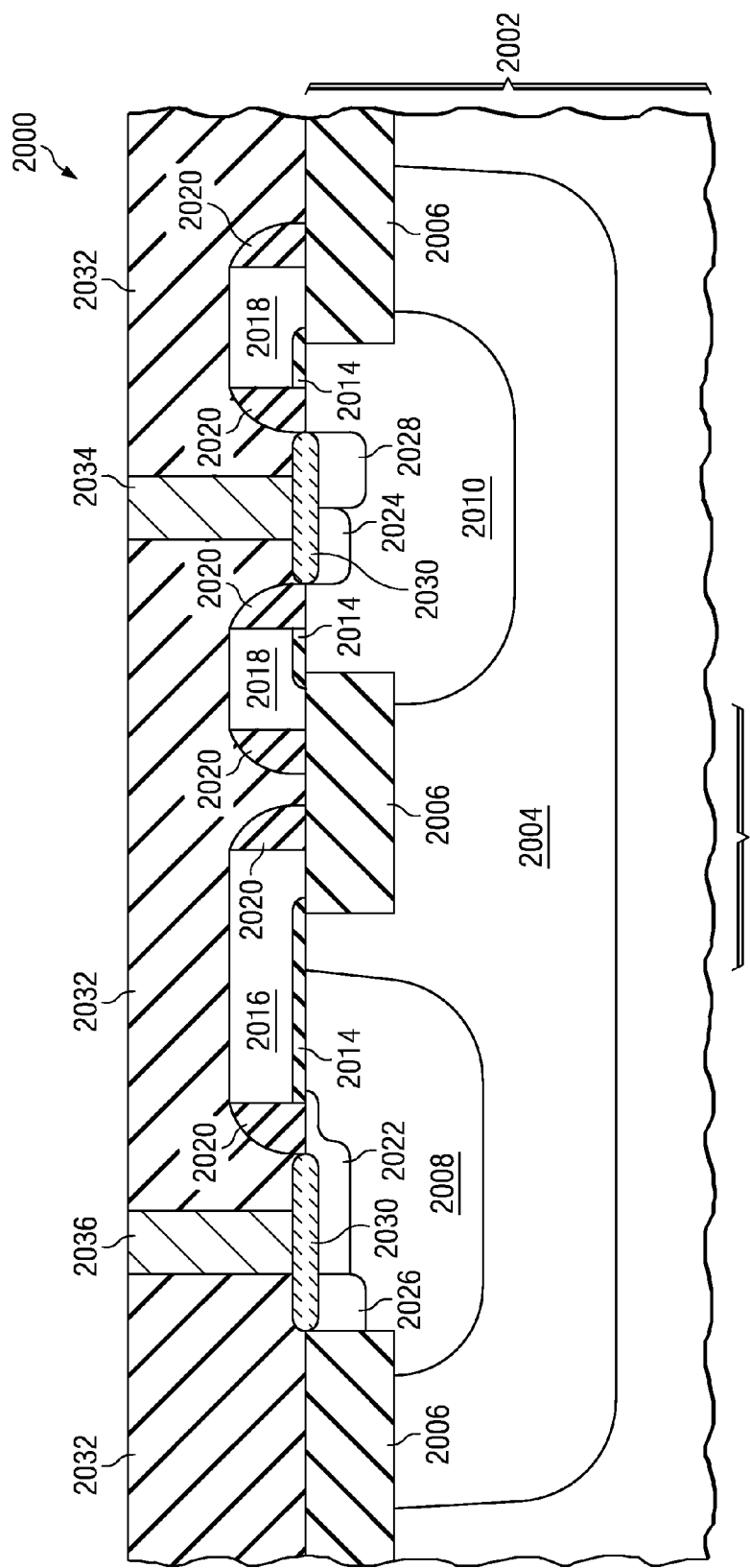

Referring to FIG. 2E, a layer of metal silicide 2030 is formed at the top surface of the substrate 2002 in the drain area and the source area. The metal silicide layer 2030 may be formed by depositing a layer of metal, such as nickel, cobalt, titanium or platinum, on a top surface of the integrated circuit 2000, heating the integrated circuit 2000 to react a portion of the metal with exposed silicon in the drain area and the source area, and selectively removing unreacted metal from the integrated circuit 2000, for example by exposing the integrated circuit 2000 to wet etchants including a mixture of an acid and hydrogen peroxide.

A pre-metal dielectric (PMD) layer 2032 is formed on an existing top surface of the integrated circuit 2000. The PMD layer 2032 may be a dielectric layer stack including a PMD liner, a PMD main layer, and an optional PMD cap layer. The PMD liner may be silicon nitride or silicon dioxide, 10 to 100 nanometers thick, deposited by plasma enhanced chemical vapor deposition (PECVD) on the existing top surface of the integrated circuit 2000. The PMD main layer may be a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer may be 10 to 100 nanometers of a hard material such as silicon nitride, silicon carbide nitride or silicon carbide, formed on a top surface of the PMD main layer.

A drain contact 2034 is formed in the PMD layer 2032 so as to make electrical contact with the drain diffused region 2024 and the SCR terminal 2028 through the metal silicide layer 2030. Similarly, a source contact 2036 is formed in the PMD layer 2032 so as to make electrical contact with the source diffused region 2022 and the body contact diffused region 2026 through the metal silicide layer 2030. The drain contact 2034 and the source contact 2036 may be formed by defining contact areas on a top surface of the PMD layer 2032 with a contact photoresist pattern, not shown in FIG. 2E for clarity, etching contact holes in the contact areas by removing PMD layer material for example using reactive ion etch (RIE) methods to expose the metal silicide layer 2030, and filling the contact holes with a contact liner metal such as titanium, and a contact fill metal such as tungsten, followed by removal of the contact fill metal from the top surface of the PMD layer 2032 for example by etchback and/or CMP methods.

During operation of the integrated circuit 2000, a potential may be applied to the drain contact 2034 with sufficient voltage to cause breakdown between the drain diffused region 2024 and the source diffused region 2022, as may occur for example in an electrostatic discharge (ESD) event. During breakdown, impact ionization may occur at and adjacent to a boundary between the RESURF region 2010 and the drift region 2012, generating holes which move toward the source diffused region 2022 and electrons which move through the RESURF region 2010 toward the drain diffused region 2024. The electrons moving through the RESURF region 2010 may increase a potential difference between the drain diffused region 2024 and the source diffused region 2022, causing a positive resistance relationship between a total current and a voltage difference between the drain diffused region 2024 and the source diffused region 2022, which may in turn reduce current filament formation in the SCRMOS transistor.

It will be recognized that a p-channel SCRMOS transistor may be formed in an integrated circuit as described in reference to FIG. 2A through FIG. 2E, with appropriate changes in polarities of dopants.

Figure 3:
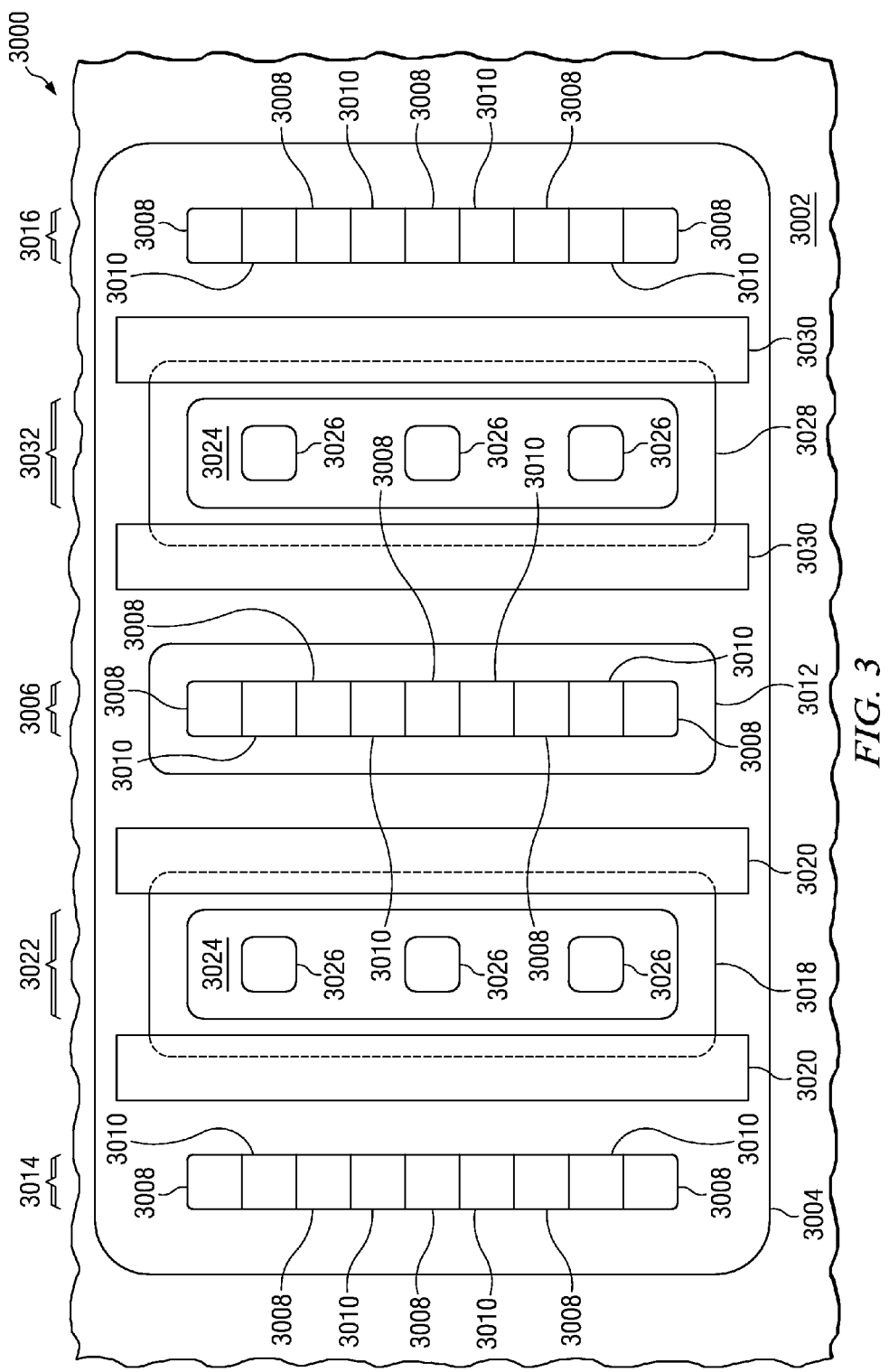
FIG. 3 is a top view of an integrated circuit containing an n-channel SCRMOS transistor formed according to an embodiment.

FIG. 3 is a top view of an integrated circuit containing an n-channel SCRMOS transistor formed according to an embodiment. The integrated circuit 3000 is formed in and on a substrate 3002 as described in reference to FIG. 1A. A deep n-well 3004 is formed in the substrate 3002 as described in reference to FIG. 1A. Elements of field oxide are not depicted in FIG. 3 for clarity.

A first drain structure 3006 includes alternating n-type drain diffused regions 3008 and p-type SCR terminals 3010. Other realizations of a first drain structure with different configurations of drain diffused regions and SCR terminals are within the scope of the instant embodiment. The drain diffused regions 3008 and SCR terminals 3010 are formed as described in reference to FIG. 1D. An n-type RESURF region 3012 is formed in the deep n-well 3004 so as to surround the first drain structure 3006 as discussed in reference to FIG. 1B through FIG. 1E.

A second drain structure 3014 and optional third drain structure 3016 are formed in the deep n-well 3004 laterally separated from the first drain structure 3006. The second drain structure 3014 and third drain structure 3016 if present include alternating n-type drain diffused regions 3008 and p-type SCR terminals 3010. In other realizations of the instant embodiment, drain diffused regions and SCR terminals may be configured differently than as depicted in FIG. 3. In the instant embodiment, the second drain structure 3014 and third drain structure 3016 if present do not contact a RESURF region.

A p-type first body region 3018 is formed in the deep n-well 3004 between the first drain structure 3006 and the second drain structure 3014, as described in reference to FIG. 1B. A first MOS gate 3020 is formed on a top surface of the substrate 3002 overlapping the first body region 3018 as described in reference to FIG. 1C. Sidewall spacers are not shown in FIG. 3 for clarity. Field plates are not shown in FIG. 3 for clarity.

A first source structure 3022 is formed in the first body region 3018. The first source structure 3022 includes an n-type source diffused region 3024 and p-type body contact diffused regions 3026. Other realizations of a first source structure with different configurations of source diffused regions and body contact diffused regions are within the scope of the instant embodiment. The source diffused region 3024 and the body contact diffused regions 3026 are formed as described in reference to FIG. 1D.

Lateral spaces between the RESURF region 3012 and the first body region 3018 and between the second drain structure 3014 and the first body region 3018 are adjusted so that breakdown between the first drain structure 3006 and the first source structure 3022 is more probable than breakdown between the second drain structure 3014 and the first source structure 3022.

If the third drain structure 3016 is present, a p-type second body region 3028 is formed in the deep n-well 3004 between the first drain structure 3006 and the third drain structure 3016. A second MOS gate 3030 is formed on a top surface of the substrate 3002 overlapping the second body region 3028. A second source structure 3032 is formed in the second body region 3028. The second source structure 3032 includes a source diffused region 3024 and body contact diffused regions 3026. Lateral spaces between the RESURF region 3012 and the second body region 3028 and between the third drain structure 3016 and the second body region 3028 are adjusted so that breakdown between the first drain structure 3006 and the second source structure 3032 is more probable than breakdown between the third drain structure 3016 and the second source structure 3032.

During operation of the integrated circuit 3000, breakdown may between the first drain structure 3006 and the first source structure 3022, or between the first drain structure 3006 and the second source structure 3032 if present, in a manner that reduces current filament formation in the SCRMOS transistor, as described in reference to FIG. 1E. SCR current may flow between the first drain structure 3006 and the first source structure 3022, and between the second drain structure 3014 and the first source structure 3022, in a manner that provides a higher current density per unit area than other SCRMOS configurations. Similarly, if the third drain structure 3016 and second source structure 3032 are present, SCR current may flow between the first drain structure 3006 and the second source structure 3032, and between the third drain structure 3016 and the second source structure 3032, in a manner that provides a higher current density per unit area than other SCRMOS configurations.

Realizations of SCRMOS transistors with other configurations of the first and second drain structures, source structures and other elements of the SCRMOS transistor than that depicted in FIG. 3 are within the scope of the instant embodiment.

It will be recognized that a p-channel SCRMOS transistor may be formed in an integrated circuit as described in reference to FIG. 3, with appropriate changes in polarities of dopants.

Figure 4:
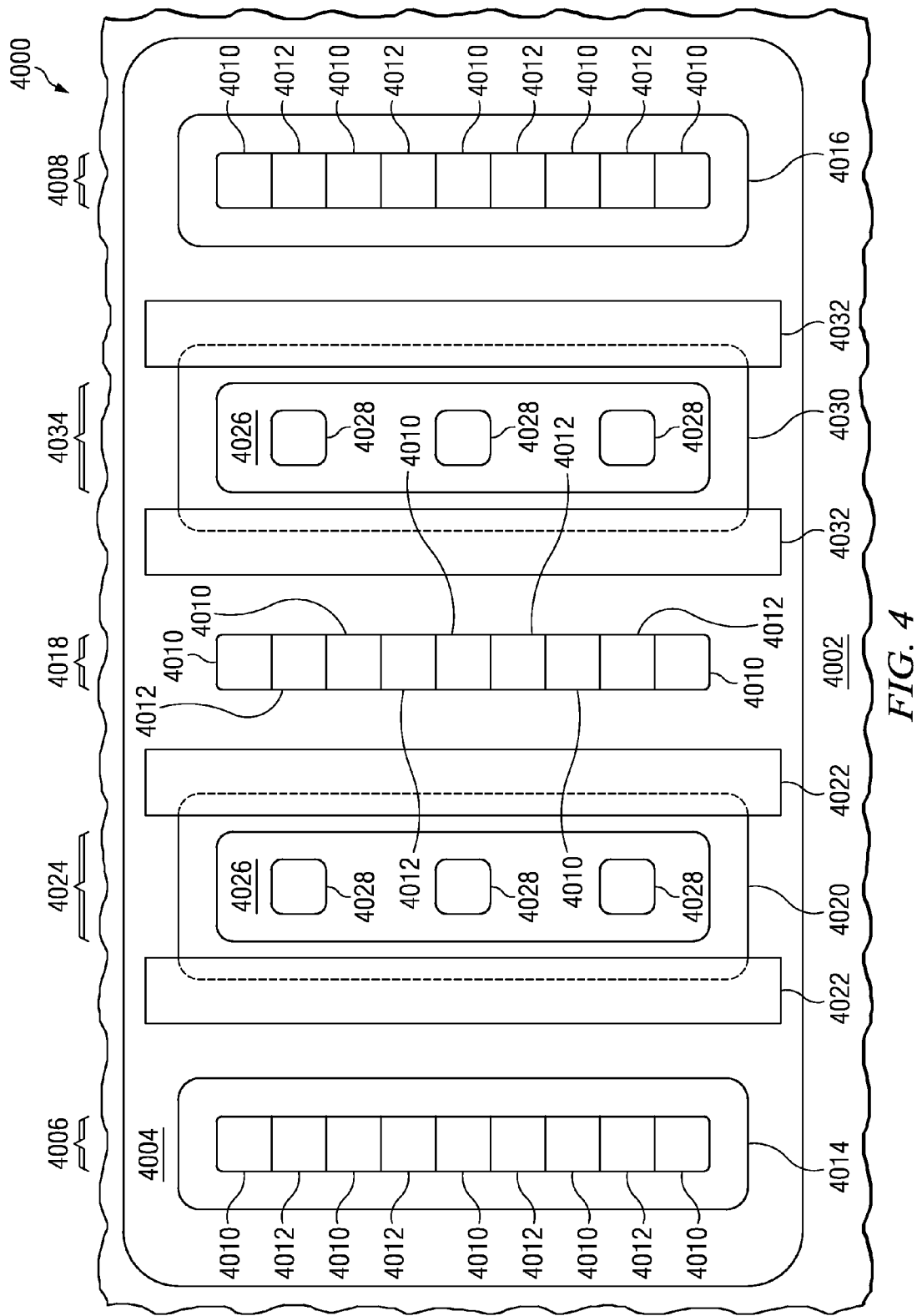
FIG. 4 is a top view of an integrated circuit containing an n-channel SCRMOS transistor formed according to an alternate embodiment.

FIG. 4 is a top view of an integrated circuit containing an n-channel SCRMOS transistor formed according to an alternate embodiment. The integrated circuit 4000 is formed in and on a substrate 4002 as described in reference to FIG. 1A. A deep n-well 4004 is formed in the substrate 4002 as described in reference to FIG. 1A. Elements of field oxide are not depicted in FIG. 4 for clarity.

A first drain structure 4006 and a second drain structure 4008 include alternating n-type drain diffused regions 4010 and p-type SCR terminals 4012. Other realizations of drain structures with different configurations of drain diffused regions and SCR terminals are within the scope of the instant embodiment. The drain diffused regions 4010 and SCR terminals 4012 are formed as described in reference to FIG. 1D. A n-type first RESURF region 4014 is formed in the deep n-well 4004 so as to surround the first drain structure 4006 as discussed in reference to FIG. 1B through FIG. 1E. Similarly, an n-type second RESURF region 4016 is formed in the deep n-well 4004 so as to surround the second drain structure 4008. The first RESURF region 4014 laterally abuts a first drift region in the deep n-well 4004, and the second RESURF region 4016 laterally abuts a second drift region in the deep n-well 4004.

A third drain structure 4018 is formed in the deep n-well 4004 between the first drain structure 4006 and the second drain structure 4006. The third drain structure 4018 includes alternating n-type drain diffused regions 4010 and p-type SCR terminals 4012. In other realizations of the instant embodiment, drain diffused regions and SCR terminals may be configured differently than as depicted in FIG. 4. In the instant embodiment, the third drain structure 4018 does not contact a RESURF region.

A p-type first body region 4020 is formed in the deep n-well 4004 between the first drain structure 4006 and the third drain structure 4018, as described in reference to FIG. 1B. A first MOS gate 4022 is formed on a top surface of the substrate 4002 overlapping the first body region 4020 as described in reference to FIG. 1C. Sidewall spacers are not shown in FIG. 4 for clarity. Field plates are not shown in FIG. 4 for clarity.

A first source structure 4024 is formed in the first body region 4020. The first source structure 4024 includes an n-type source diffused region 4026 and p-type body contact diffused regions 4028. Other realizations of a first source structure with different configurations of source diffused regions and body contact diffused regions are within the scope of the instant embodiment. The source diffused region 4026 and the body contact diffused regions 4028 are formed as described in reference to FIG. 1D.

Lateral spaces between the first RESURF region 4014 and the first body region 4020 and between the third drain structure 4018 and the first body region 4020 are adjusted so that breakdown between the first drain structure 4006 and the first source structure 4024 is more probable than breakdown between the third drain structure 4018 and the first source structure 4024.

Similarly, a p-type second body region 4030 is formed in the deep n-well 4004 between the second drain structure 4008 and the third drain structure 4018. A second MOS gate 4032 is formed on a top surface of the substrate 4002 overlapping the second body region 4030. A second source structure 4034 is formed in the second body region 4030. The second source structure 4034 includes a source diffused region 4026 and body contact diffused regions 4028. Lateral spaces between the second RESURF region 4016 and the second body region 4030 and between the third drain structure 4018 and the second body region 4030 are adjusted so that breakdown between the second drain structure 4008 and the second source structure 4034 is more probable than breakdown between the third drain structure 4018 and the second source structure 4034.

During operation of the integrated circuit 4000, breakdown may between the first drain structure 4006 and the first source structure 4024, or between the second drain structure 4008 and the second source structure 4034, in a manner that reduces current filament formation in the SCRMOS transistor, as described in reference to FIG. 1E. SCR current may flow between the first drain structure 4006 and the first source structure 4024, between the second drain structure 4008 and the second source structure 4034, between the third drain structure 4018 and the first source structure 4024, and between the third drain structure 4018 and the second source structure 4034, in a manner that provides a higher current density per unit area than other SCRMOS configurations Realizations of SCRMOS transistors with other configurations of the drain structures, source structures and other elements of the SCRMOS transistor than that depicted in FIG. 4 are within the scope of the instant embodiment.

It will be recognized that a p-channel SCRMOS transistor may be formed in an integrated circuit as described in reference to FIG. 4, with appropriate changes in polarities of dopants.

Figure 5:
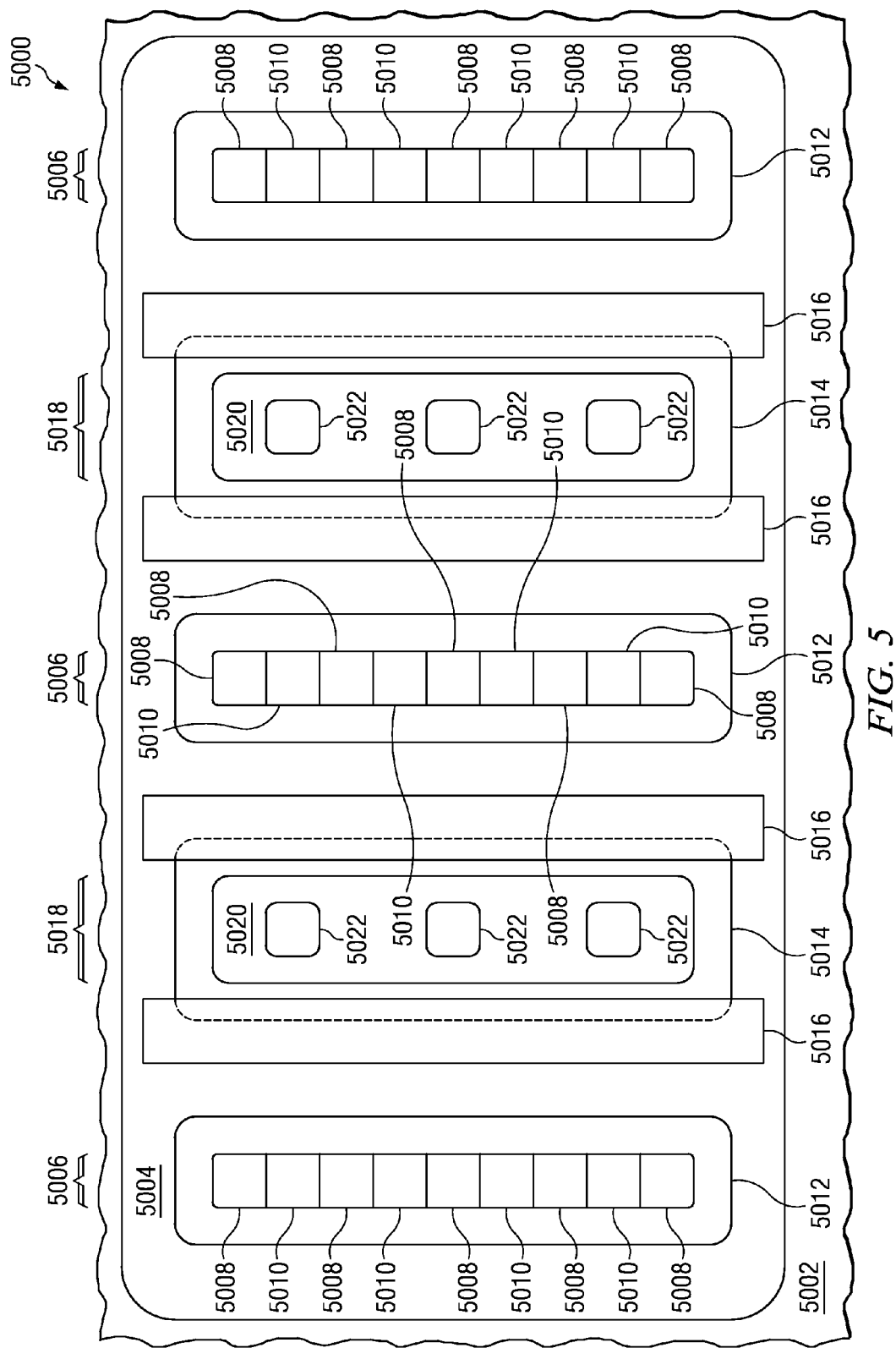
FIG. 5 is a top view of an integrated circuit containing an n-channel SCRMOS transistor formed according to a further embodiment.

FIG. 5 is a top view of an integrated circuit containing an n-channel SCRMOS transistor formed according to a further embodiment. The integrated circuit 5000 is formed in and on a substrate 5002 as described in reference to FIG. 1A. A deep n-well 5004 is formed in the substrate 5002 as described in reference to FIG. 1A. Elements of field oxide are not depicted in FIG. 5 for clarity.

Drain structures 5006 include alternating n-type drain diffused regions 5008 and p-type SCR terminals 5010. Other realizations of drain structures with different configurations of drain diffused regions and SCR terminals are within the scope of the instant embodiment. The drain diffused regions 5008 and SCR terminals 5010 are formed as described in reference to FIG. 1D. N-type RESURF regions 5012 are formed in the deep n-well 5004 so as to surround the drain structures 5006 as discussed in reference to FIG. 1B through FIG. 1E. Each RESURF region 5012 laterally abuts at least one drift region in the deep n-well 5004.

P-type body regions 5014 are formed in the deep n-well 5004 between the drain structures 5006, as described in reference to FIG. 1B. MOS gates 5016 are formed on a top surface of the substrate 5002 overlapping the body regions 5014 as described in reference to FIG. 1C. Sidewall spacers are not shown in FIG. 5 for clarity. Field plates are not shown in FIG. 5 for clarity.

Source structures 5018 are formed in the body regions 5014. The source structures 5018 include n-type source diffused regions 5020 and p-type body contact diffused regions 5022. Other realizations of source structures with different configurations of source diffused regions and body contact diffused regions are within the scope of the instant embodiment. The source diffused region 5020 and the body contact diffused regions 5022 are formed as described in reference to FIG. 1D.

During operation of the integrated circuit 5000, breakdown may between the drain structures 5006 and the source structures 5018 in a manner that reduces current filament formation in the SCRMOS transistor, as described in reference to FIG. 1E.

Realizations of SCRMOS transistors with other configurations of the drain structures, source structures and other elements of the SCRMOS transistor than that depicted in FIG. 5 are within the scope of the instant embodiment.

It will be recognized that a p-channel SCRMOS transistor may be formed in an integrated circuit as described in reference to FIG. 5, with appropriate changes in polarities of dopants.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a semiconductor substrate, said substrate having a first conductivity type; and
   an SCRMOS transistor formed in and on said substrate, said SCRMOS transistor having:
      a deep well formed in said substrate, said deep well having an opposite conductivity type from said substrate, in which said deep well has a drift region;
      a RESURF region formed in said deep well so that said RESURF region laterally abuts said drift region, said RESURF region having a same conductivity type as said deep well, in which a doping density of said RESURF region is at least two times a doping density of said drift region;
      a body region formed in said deep well so that said body region laterally abuts said drift region opposite from said RESURF region, said body region having an opposite conductivity type from said deep well;
      an MOS gate formed over said substrate such that said MOS gate overlaps a portion of said body region;
      a drain structure formed in said drain RESURF region, said drain structure having:
         a drain diffused region, said drain diffused region having a same conductivity type as said RESURF region, such that a doping density of said drain diffused region is at least three times greater than said doping density of said RESURF region; and
         an SCR terminal, said SCR terminal having an opposite conductivity type from said RESURF region; and
      a source structure formed in said body region, said source structure having:
         a source diffused region adjacent to said MOS gate, said source diffused region having a same conductivity type as said deep well; and
         a body contact diffused region, said body contact diffused region having a same conductivity type as said body region.

2. The integrated circuit of claim 1, in which said SCRMOS transistor further has:
   a second drain structure formed in said deep well, said second drain structure having:
      a second drain diffused region, said second drain diffused region having a same conductivity type as said deep well; and
      an SCR terminal, said SCR terminal having an opposite conductivity type from said deep well;
   such that:
      said second drain structure does not contact a RESURF region.

3. The integrated circuit of claim 2, in which said SCRMOS transistor further has:
   a second drift region in said deep well;
   a second RESURF region formed in said deep well so that said RESURF region laterally abuts said second drift region, said second RESURF region having a same conductivity type as said deep well, in which a doping density of said second RESURF region is at least two times a doping density of said drift region; and
   a third drain structure formed in said second RESURF region, said third drain structure having:
      a third drain diffused region, said third drain diffused region having a same conductivity type as said second RESURF region, such that a doping density of said third drain diffused region is at least three times greater than said doping density of said second RESURF region; and
      a third SCR terminal, said third SCR terminal having an opposite conductivity type from said second RESURF region.

4. The integrated circuit of claim 1, in which said SCRMOS transistor further has:
   a plurality of RESURF regions formed in said deep well, such that:
      each RESURF region laterally abuts at least one drift region;
      each RESURF region has a same conductivity type as said deep well; and
      a doping density of each RESURF region is at least two times a doping density of said laterally abutting drift region; and
   a plurality of drain structures formed in said RESURF regions, said drain structures having:
      a drain diffused region, said drain diffused region having a same conductivity type as said RESURF region containing said drain diffused region, such that a doping density of said second drain diffused region is at least three times greater than a doping density of said second RESURF region containing said drain diffused region; and
      an SCR terminal, said SCR terminal having an opposite conductivity type from said RESURF region containing said SCR terminal;

such that every drain structure in said SCRMOS transistor is surrounded by a RESURF region.

5. The integrated circuit of claim 1, in which:
said substrate is p-type;
said deep well is n-type;
said RESURF region is n-type;
said body region is p-type;
said drain diffused region is n-type;
said SCR terminal is p-type;
said source diffused region is n-type; and
said body contact diffused region is p-type.

6. The integrated circuit of claim 1, in which:
said substrate is n-type;
said deep well is p-type;
said RESURF region is p-type;
said body region is n-type;
said drain diffused region is p-type;
said SCR terminal is n-type;
said source diffused region is p-type; and
said body contact diffused region is n-type.

7. An SCRMOS transistor, comprising:
a deep well, said deep well having a first conductivity type, in which said deep well has a drift region;
a RESURF region formed in said deep well so that said RESURF region laterally abuts said drift region, said RESURF region having a same conductivity type as said deep well, in which a doping density of said RESURF region is at least two times a doping density of said drift region;
a body region formed in said deep well so that said body region laterally abuts said drift region opposite from said RESURF region, said body region having an opposite conductivity type from said deep well;
an MOS gate, such that said MOS gate overlaps a portion of said body region;
a drain structure formed in said drain RESURF region, said drain structure having:
    a drain diffused region, said drain diffused region having a same conductivity type as said RESURF region, such that a doping density of said drain diffused region is at least three times greater than said doping density of said RESURF region; and
    an SCR terminal, said SCR terminal having an opposite conductivity type from said RESURF region; and
a source structure formed in said body region, said source structure having:
    a source diffused region adjacent to said MOS gate, said source diffused region having a same conductivity type as said deep well; and
    a body contact diffused region, said body contact diffused region having a same conductivity type as said body region.

8. The SCRMOS transistor of claim 7, further having:
a second drain structure formed in said deep well, said second drain structure having:
    a second drain diffused region, said second drain diffused region having a same conductivity type as said deep well; and
    an SCR terminal, said SCR terminal having an opposite conductivity type from said deep well;
such that:
    said second drain structure does not contact a RESURF region.

9. The SCRMOS transistor of claim 8, further having:
a second drift region in said deep well;
a second RESURF region formed in said deep well so that said RESURF region laterally abuts said second drift region, said second RESURF region having a same conductivity type as said deep well, in which a doping density of said second RESURF region is at least two times a doping density of said drift region; and
a third drain structure formed in said second RESURF region, said third drain structure having:
    a third drain diffused region, said third drain diffused region having a same conductivity type as said second RESURF region, such that a doping density of said third drain diffused region is at least three times greater than said doping density of said second RESURF region; and
    a third SCR terminal, said third SCR terminal having an opposite conductivity type from said second RESURF region.

10. The SCRMOS transistor of claim 7, further having:
a plurality of RESURF regions formed in said deep well, such that:
    each RESURF region laterally abuts at least one drift region;
    each RESURF region has a same conductivity type as said deep well; and
    a doping density of each RESURF region is at least two times a doping density of said laterally abutting drift region; and
a plurality of drain structures formed in said RESURF regions, said drain structures having:
    a drain diffused region, said drain diffused region having a same conductivity type as said RESURF region containing said drain diffused region, such that a doping density of said second drain diffused region is at least three times greater than a doping density of said second RESURF region containing said drain diffused region; and
    an SCR terminal, said SCR terminal having an opposite conductivity type from said RESURF region containing said SCR terminal;
such that every drain structure in said SCRMOS transistor is surrounded by a RESURF region.

11. The integrated circuit of claim 7, in which:
said deep well is n-type;
said RESURF region is n-type;
said body region is p-type;
said drain diffused region is n-type;
said SCR terminal is p-type;
said source diffused region is n-type; and
said body contact diffused region is p-type.

12. The integrated circuit of claim 7, in which:
said deep well is p-type;
said RESURF region is p-type;
said body region is n-type;
said drain diffused region is p-type;
said SCR terminal is n-type;
said source diffused region is p-type; and
said body contact diffused region is n-type.

13. A process of forming an integrated circuit, comprising steps:
providing a semiconductor substrate, said substrate having a first conductivity type; and
forming an SCRMOS transistor in and on said substrate, by a process having steps:
    forming a deep well in said substrate, so that said deep well has an opposite conductivity type from said substrate, and in which said deep well has a drift region;
    forming a RESURF region in said deep well so that said RESURF region laterally abuts said drift region, so that said RESURF region has a same conductivity type as said deep well, and so that a doping density of said RESURF region is at least two times a doping density of said drift region;

forming a body region in said deep well so that said body region laterally abuts said drift region opposite from said RESURF region, and so that said body region has an opposite conductivity type from said deep well;

forming an MOS gate over said substrate so that said MOS gate overlaps a portion of said body region;

forming a drain structure in said drain RESURF region, by a process having steps:
  forming a drain diffused region, so that said drain diffused region has a same conductivity type as said RESURF region, and so that a doping density of said drain diffused region is at least three times greater than said doping density of said RESURF region; and
  forming an SCR terminal, so that said SCR terminal has an opposite conductivity type from said RESURF region; and forming a source structure in said body region, by a process having steps:
  forming a source diffused region adjacent to said MOS gate, so that said source diffused region has a same conductivity type as said deep well; and
  forming a body contact diffused region, so that said body contact diffused region has a same conductivity type as said body region.

14. The process of claim 13, having additional steps:
forming a second drain structure in said deep well, by a process having steps:
  forming a second drain diffused region, so that said second drain diffused region has a same conductivity type as said deep well; and
  forming an SCR terminal, so that said SCR terminal has an opposite conductivity type from said deep well;
so that:
  said second drain structure does not contact a RESURF region.

15. The process of claim 14, having additional steps:
forming said deep well so as to have a second drift region;
forming a second RESURF region in said deep well so that said RESURF region laterally abuts said second drift region, so that said second RESURF region has a same conductivity type as said deep well, and so that a doping density of said second RESURF region is at least two times a doping density of said drift region; and
forming a third drain structure in said deep well, by a process having steps:
  forming a third drain diffused region, so that third drain diffused region has a same conductivity type as said second RESURF region, and so that a doping density of said third drain diffused region is at least three times greater than said doping density of said second RESURF region; and
  forming a third SCR terminal, so that said third SCR terminal has an opposite conductivity type from said second RESURF region.

16. The process of claim 13, having additional steps:
forming a plurality of RESURF regions in said deep well, so that:
  each RESURF region laterally abuts at least one drift region;
  each RESURF region has a same conductivity type as said deep well; and
  a doping density of each RESURF region is at least two times a doping density of said laterally abutting drift region; and
forming a plurality of drain structures in said RESURF regions, by a process having steps:
  forming a drain diffused region, so that said drain diffused region has a same conductivity type as said RESURF region containing said drain diffused region, and so that a doping density of said second drain diffused region is at least three times greater than a doping density of said second RESURF region containing said drain diffused region; and
  forming an SCR terminal, so that said SCR terminal has an opposite conductivity type from said RESURF region containing said SCR terminal;
so that every drain structure in said SCRMOS transistor is surrounded by a RESURF region.

17. The process of claim 13, in which:
said substrate is p-type;
said deep well is n-type;
said RESURF region is n-type;
said body region is p-type;
said drain diffused region is n-type;
said SCR terminal is p-type;
said source diffused region is n-type; and
said body contact diffused region is p-type.

18. The process of claim 13, in which:
said substrate is n-type;
said deep well is p-type;
said RESURF region is p-type;
said body region is n-type;
said drain diffused region is p-type;
said SCR terminal is n-type;
said source diffused region is p-type; and
said body contact diffused region is n-type.

* * * * *